(12) United States Patent
Hedden

(10) Patent No.: US 11,276,450 B2
(45) Date of Patent: Mar. 15, 2022

(54) REFRESH CIRCUITRY

(71) Applicant: Micron Technology, Inc., Boise, ID (US)

(72) Inventor: Richard N. Hedden, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/356,358

(22) Filed: Mar. 18, 2019

(65) Prior Publication Data

US 2019/0214071 A1 Jul. 11, 2019

Related U.S. Application Data

(63) Continuation of application No. 15/614,983, filed on Jun. 6, 2017, now Pat. No. 10,304,515, which is a continuation of application No. 15/090,771, filed on Apr. 5, 2016, now Pat. No. 9,741,421.

(51) Int. Cl.
| | |
|---|---|
| *G11C 8/10* | (2006.01) |
| *G11C 11/406* | (2006.01) |
| *G11C 29/00* | (2006.01) |
| *G11C 11/4078* | (2006.01) |
| *G11C 11/408* | (2006.01) |

(52) U.S. Cl.
CPC ...... *G11C 11/406* (2013.01); *G11C 11/40622* (2013.01); *G11C 29/76* (2013.01); *G11C 29/783* (2013.01); *G11C 11/408* (2013.01); *G11C 11/4078* (2013.01)

(58) Field of Classification Search
CPC ... G11C 11/408; G11C 29/78; G11C 11/4078; G11C 11/406
USPC .......................................................... 365/222
See application file for complete search history.

(56) References Cited

U.S. PATENT DOCUMENTS

| | | | |
|---|---|---|---|
| 6,731,560 | B2 | 5/2004 | Yoon et al. |
| 8,902,687 | B2 | 12/2014 | Hosoe |
| 9,032,141 | B2 | 5/2015 | Bains |
| 9,190,131 | B2 | 11/2015 | Song |
| 9,257,169 | B2* | 2/2016 | Jung ................. G11C 11/40622 |
| 2009/0161457 | A1 | 6/2009 | Wakimoto |
| 2013/0304982 | A1* | 11/2013 | Jung ................. G11C 11/40622 711/106 |
| 2014/0095780 | A1 | 4/2014 | Bains |
| 2014/0146624 | A1 | 5/2014 | Son et al. |
| 2014/0156923 | A1 | 6/2014 | Bains et al. |
| 2014/0219043 | A1 | 8/2014 | Jones et al. |

(Continued)

FOREIGN PATENT DOCUMENTS

KR 20130115066 A 10/2013

OTHER PUBLICATIONS

Search Report from related European patent application No. 17779500.2, dated Mar. 6, 2019, 9 pp.

(Continued)

*Primary Examiner* — Xiaochun L Chen
(74) *Attorney, Agent, or Firm* — Brooks, Cameron & Huebsch, PLLC

(57) ABSTRACT

The present disclosure includes apparatuses and methods related to refresh circuitry. An example apparatus can include a memory array including a main portion and a redundant portion. The apparatus can include refresh circuitry configured to, responsive to a determination of a hammering event, refresh at least a portion of the redundant portion.

8 Claims, 4 Drawing Sheets

(56) References Cited

U.S. PATENT DOCUMENTS

| | | |
|---|---|---|
| 2014/0281206 A1 | 9/2014 | Crawford et al. |
| 2014/0281207 A1 | 9/2014 | Mandava et al. |
| 2015/0063049 A1 | 3/2015 | Yang |
| 2015/0109871 A1 | 4/2015 | Bains et al. |
| 2015/0340077 A1 | 11/2015 | Akamatsu |
| 2015/0380073 A1 | 12/2015 | Joo et al. |
| 2016/0005452 A1 | 1/2016 | Bae et al. |
| 2016/0027531 A1 | 1/2016 | Jones et al. |
| 2016/0027532 A1 | 1/2016 | Kim |
| 2016/0085466 A1 | 3/2016 | Benedict et al. |
| 2016/0086649 A1 | 3/2016 | Hong et al. |
| 2016/0224262 A1 | 8/2016 | Mandava et al. |

OTHER PUBLICATIONS

International Search Report and Written Opinion from related international application No. PCT/US2017/022047, dated Jun. 7, 2017, 15 pp.

Office Action from related Taiwanese patent application No. 106110794, dated Jan. 22, 2018, 14 pp.

Communication Pursuant to Article 94(3) EPC from related European patent application No. 17779500.2, dated Sep. 25, 2019, 7 pages.

\* cited by examiner

REFRESH CIRCUITRY

PRIORITY INFORMATION

This application is a Continuation of U.S. application Ser. No. 15/614,983, filed Jun. 6, 2017, which is a Continuation of U.S. application Ser. No. 15/090,771 filed Apr. 5, 2016, now U.S. Pat. No. 9,741,421, the specification of which is incorporated herein by reference.

TECHNICAL FIELD

The present disclosure relates generally to semiconductor memory and methods, and more particularly, to apparatuses and methods related to refresh circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others.

As memory density has increased, intermittent failure has appeared in some devices, such as DRAM memories, which may experience failures due to repeated access to a particular row of memory cells (e.g., cells coupled to an access line) within a refresh window associated with the cells. For example, rows physically adjacent to a row being frequently accessed within the refresh window have an increased probability of experiencing data corruption. The repeated access of a particular row can be referred to as a "hammering" event, and the hammering of a row can cause issues such as migration across a passgate, for example. Leakage and parasitic currents caused by the hammering of a row can cause data corruption in a non-accessed physically adjacent row, which may be referred to as a neighbor row or victim row. The resulting corruption issue may be referred to as hammer disturb and/or row hammer disturb, for instance.

Some previous approaches to reducing the adverse effects of row hammering on adjacent rows include refreshing adjacent rows responsive to a determination that a hammering event has occurred. For example, responsive to determining that a particular row has been the target of repeated accesses (e.g., the row has undergone more than a threshold number of accesses within a refresh period), its physically adjacent neighbor rows can be selected for a targeted refresh operation, which may be referred to as a row hammer refresh operation.

The row hammer effect is due to the nature of a memory cell, which can include one transistor and one capacitor. The charge state of a capacitor is what determines whether a DRAM cell stores a "1" or "0" as a binary value. In addition, a large number of DRAM cells are packed tightly together. The closely packed cells can cause an activated capacitor to have an effect on a charge of an adjacent capacitor, especially when one of the cells is rapidly activated (e.g., a row hammer effect). In addition, the capacitors can have a natural discharge rate and may be rewritten in order to compensate for this discharge, referred to as "refreshing."

DETAILED DESCRIPTION

Figure 1:
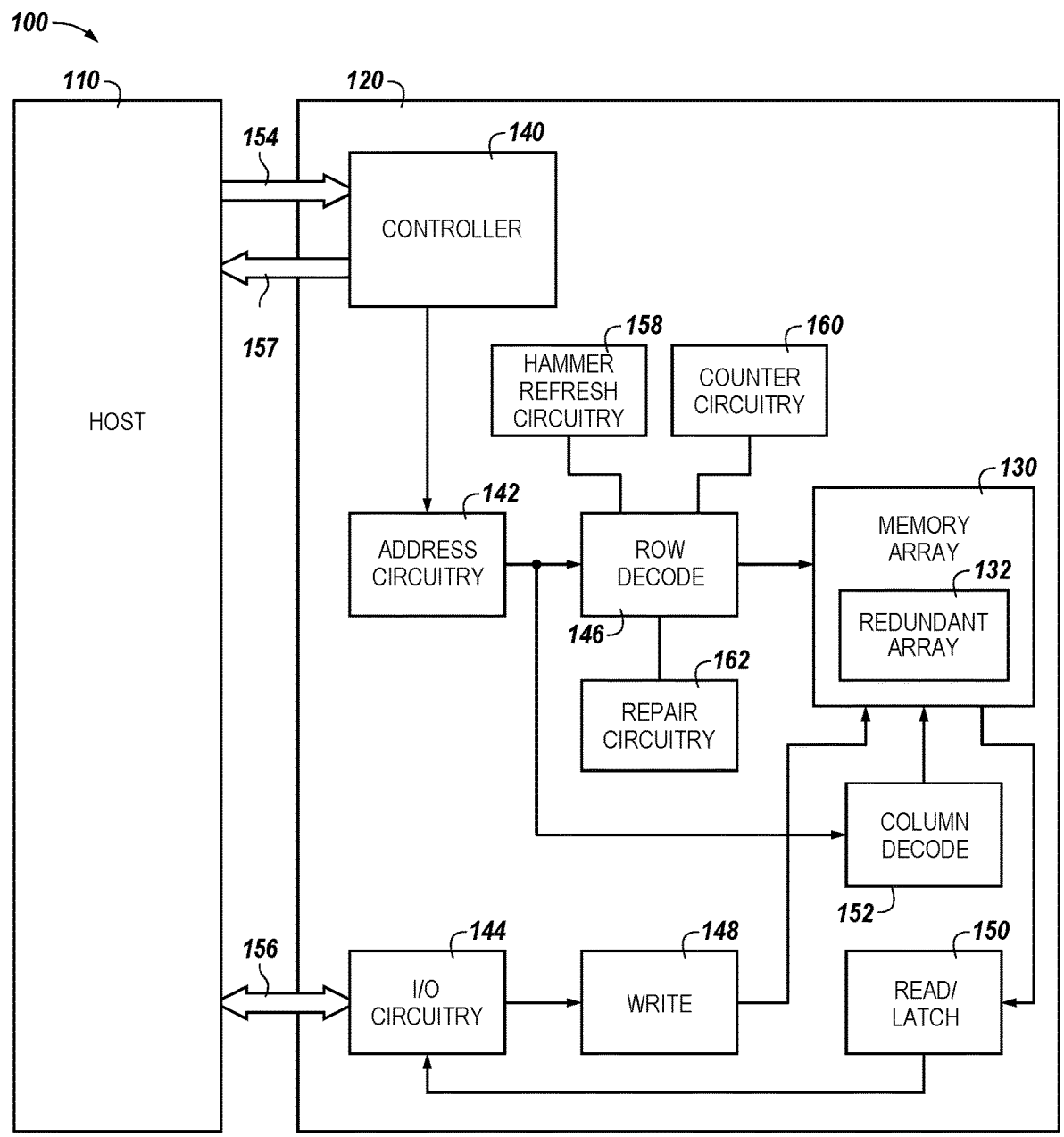
FIG. 1 is a block diagram of an apparatus in the form of a computing system including a memory device in accordance with a number of embodiments of the present disclosure.

The present disclosure includes apparatuses and methods related to refresh circuitry. An example apparatus comprises a memory array including a main portion of memory cells and a redundant portion of memory cells. The example apparatus can include refresh circuitry configured to, responsive to a determination of a hammering event, refresh at least a portion of the redundant portion.

In some embodiments, time and/or resources can be preserved by refreshing an entire redundant portion of a memory array when at least one row of the redundant portion experiences a hammering event. For example, in some approaches using additional time and/or resources, when a physical address corresponding to a row in the main portion is remapped to a redundant portion (e.g., when the row in the main portion includes a defect, rows adjacent to the row of the physical address in the main portion can be refreshed. A redundant portion herein refers to additional rows of cells to which rows of a main array portion can be remapped (e.g., due to row defects in the main array). However, since the physical address associated with the row in the main portion has been remapped to be associated with the redundant portion, the adjacent rows are unnecessarily refreshed while rows adjacent to the redundant row in the redundant portion should be refreshed to avoid a row hammer disturb. By refreshing a redundant portion in response to a hammering event associated with a physical address that has been remapped, rather than determining which redundant rows are adjacent to the redundant row being hammered, a correlation between physical addresses of the main portion and the redundant portion can be avoided.

A main portion of a memory array can include a number of groups of memory cells each coupled to one of a respective number of access lines (e.g., in rows of memory cells). For example, a first row of cells, a second row of cells, and a third row of cells can be three adjacent rows of cells. In response to the second row (e.g., middle row) of cells being accessed (e.g., activated, selected, etc.) in rapid succession, the first row and the second row can experience leakage and/or interact electrically. Therefore, the first and third rows of cells (e.g., victim rows) can be refreshed, referred to herein as a row hammer refresh, at a particular rate corresponding to the activation rate of the second row of cells (e.g., the hammered row).

However, in a number of instances, a physical row of cells in the main array may be remapped to a row in the redundant portion such that a request to access the physical address associated with the remapped row (e.g., the second row in the main array portion) results in an access of the redundant row. When the requests to access the second row of cells are sent in rapid succession, a row hammer refresh may be triggered for the first row of cells and the second row of cells. However, since the second row of cells has been relocated, the actual activation is occurring in the redundant row and the adjacent row of cells of the redundant row should receive the row hammer refresh rather than the first and the third row of cells in the main array (e.g., non-redundant array).

In some instances including a DRAM, an antifuse is used to relocate a row address from the main array to a redundant row address. However, in an embodiment including a hybrid memory cube (HMC), the DRAM of the HMC may not include antifuses and therefore may not have a way of indicating whether a row address has been remapped to a redundant row address. In this case, the logic die of the HMC might monitor refreshing and reference an SRAM look-up table for repairing address information. A mapping table can keep track of a correspondence between a row of cells with an error (e.g., the second row of the main array) and where in the redundant array the data of the row of cells with an error has been relocated. Accessing a mapping table can increase a period of time it takes to perform a row hammer refresh and/or consume power and access resources. For example, since the redundant array may be a smaller subset of the corresponding main array, the entire redundant array can be refreshed more efficiently and with fewer resources than accessing a mapping table and determining which adjacent rows of a hammered row would be refreshed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 230 may reference element "30" in FIG. 2, and a similar element may be referenced as 330 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or a controller 140, and/or read/latch circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. For instance, the system 100 can be a hybrid memory cube (HMC) where control components (e.g., controller 140) can be located on a logic die and memory components (e.g., memory array 130 and redundant array 132) can be located in a number of stacked dies.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). Also, although arrays 130 and 132 are labeled as separate arrays, redundant array 132 can be a portion of array 130. For instance, array 130 can include a main portion and a redundant portion to which rows of the main portion may be remapped, for example.

The memory device 120 includes address circuitry 142 to latch address signals provided over an I/O bus 156 (e.g., a data bus) through I/O circuitry 144. Address signals may also be received to controller 140 (e.g., via address circuitry 142 and/or via bus 154). Address signals are received and decoded by a row decoder 146 and a column decoder 152 to access the memory array 130. A number of circuitries, including refresh circuitry 158, counter circuitry 160, and repair circuitry 162, can be coupled to the row decoder 146 for purpose of monitoring activation of memory cells (e.g., rows of cells) and/or performing refreshes (e.g., row hammer refreshes) of cells. Data can be read from memory array 130 by sensing voltage and/or current changes on the data lines using read/latch circuitry 150. The read/latch circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of control circuitry. Controller 140 can be implemented in hardware, firmware, and/or software. While the controller 140 is illustrated as coupled to particular components (e.g., coupled to memory array 130 and address circuitry 142), the controller can be coupled to any of the components within memory device 120 (e.g., refresh circuitry 158, counter circuitry 160, and/or repair circuitry 162).

Figure 2:
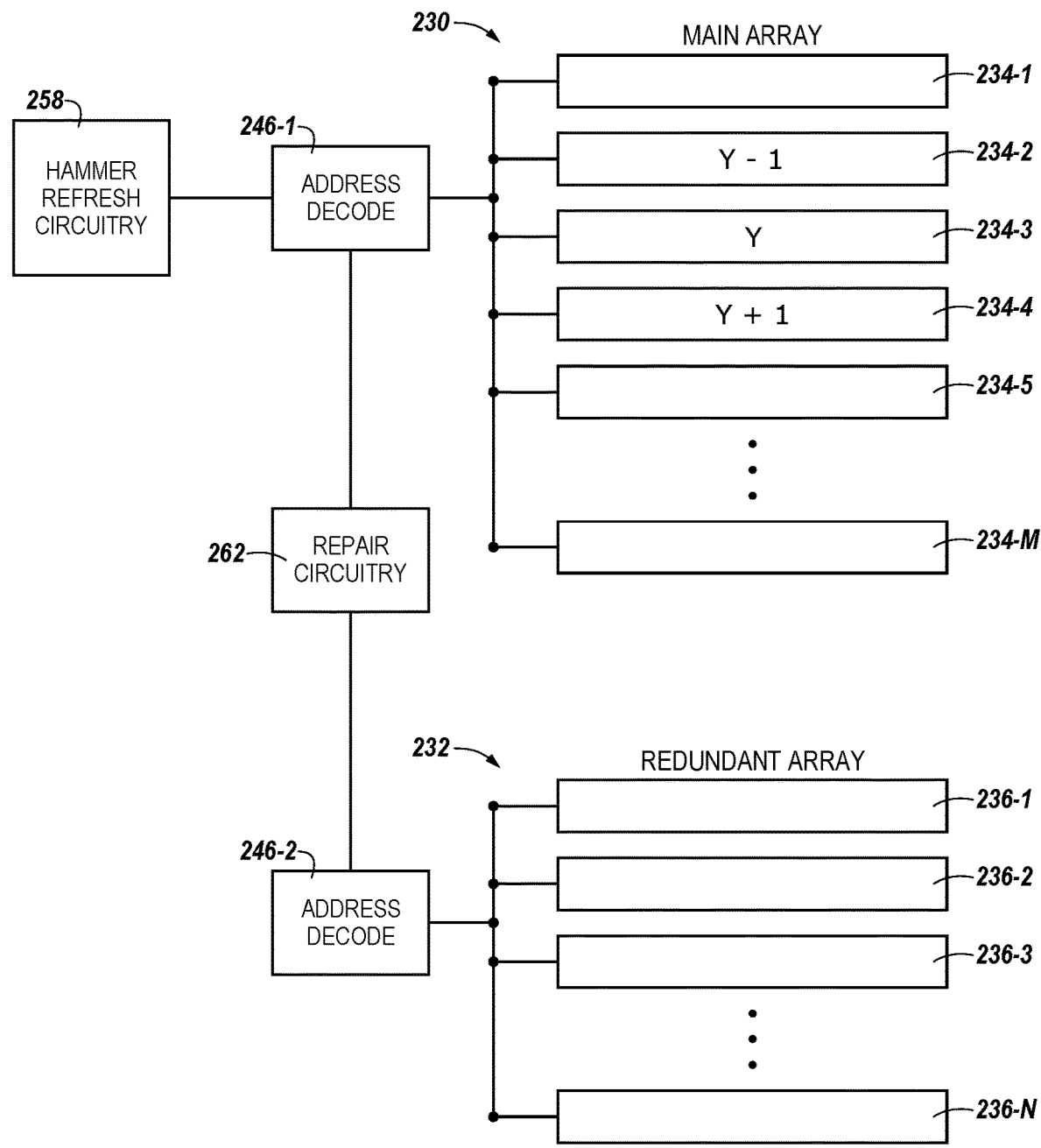
FIG. 2 is a schematic diagram illustrating a portion of a memory array in accordance with a number of embodiments of the present disclosure.

FIG. 2 is a schematic diagram illustrating a portion of a memory array in accordance with a number of embodiments of the present disclosure. The portion of the memory array illustrated in FIG. 2 can include a main memory array (e.g., non-redundant array) 230 and a redundant memory array 232. The main memory array 230 can include a number of groups of memory cells 234-1, 234-2, 234-3, 234-4, 234-5, . . . , 234-M coupled to respective an access lines (e.g., the group of memory cells are "rows" of memory cells, as illustrated). A first row of cells 234-1 are coupled to a first access line, a second row of cells 234-2 is coupled to a second access line, a third row of cells 234-3 is coupled to a third access line, a fourth row of cells 234-4 is coupled to a fourth access line, a fifth row of cells 234-5 is coupled to a fifth access line, . . . , and an Mth row of cells 234-M is coupled to an Mth access line. The designator "Y" is used to indicate a row that experiences a hammering event, and the designators "Y−1" and "Y+1" are used to indicate rows that are adjacent to the row experiencing the hammering event. A hammering event can include a controller (e.g., controller 140 in FIG. 1) accessing a portion (e.g., accessing row 234-3) of the redundant portion 232 greater than a threshold number of times in a particular amount of time (e.g., at a particular rate). A determination of whether a hammering event has occurred can include determining a particular number of accesses The redundant array 232 can include a number of groups of memory cells 236-1, 236-2, 236-3, . . . , 236-N also coupled to respective access lines. The redundant array 232 can include a number of rows used for remapping respective rows of the main array 230. Physical addresses associated with the main array 230 can be remapped to the redundant array 232 in order to bypass defective (e.g., errored, malfunctioning, etc.) memory cells. For example, a physical address associated with a particular row (e.g., 234-1) of main array 230 can be remapped to a particular row (e.g., 236-1) of redundant array 232. In response to the physical address of row 234-1 being remapped to row 236-1, a request to access the physical address results in an access of row 236-1 rather than an access of row 234-1. Likewise, other rows (e.g., 234-2 to 234-M) of main array 230 can be remapped to rows of redundant array 232. While the redundant array 232 is described as including a number of rows of memory cells associated with a particular number of physical addresses, embodiments are not so limited. For example, when the main array 230 includes no defects, there may be no physical addresses associated with the redundant array 232. In some embodiments, as illustrated, the redundant array 232 includes fewer memory cells (e.g., fewer rows of cells) than the the main array 230.

The main array 230 includes an address decode (e.g., row address decode) 246-1 and the redundant array 232 includes an address decode 246-2. The address decode 246-1 can be used to access (e.g., select) a particular row of memory cells (e.g., row 234-1) in response to receiving a request to access the particular row of memory cells. Likewise, the address decode 246-2 can be used to select a particular group of memory cells (e.g., row 236-1) in response to receiving a request to access a particular row of cells that has been remapped to row 236-1.

The repair circuit 262 can be used to repair rows of array 230 (e.g., in response to a row becoming defective). The repair of the row can include remapping an address associated with a row in array 230 to a redundant row in array 232. The refresh circuit 258 can include logic configured to refresh rows of memory cells (e.g., to refresh victim rows as part of a hammer refresh operation).

As an example, consider a hammering event occurring to row 234-3 (designated by "Y"). Row 234-3 can be determined to have experienced a row hammer event by determining that it has been accessed (e.g., activated) at a particular rate. The particular rate of activation can be based on a predetermined row hammer threshold. For example, the activation rate that triggers a row hammer event determination can be variable and can depend on how little or how much row hammer effect is acceptable. Occurrence of a row hammering event on the row 234-3 can affect data stored in cells coupled to adjacent rows (e.g., rows 234-2 and/or 234-4). In order to compensate for this row hammer effect, the adjacent rows 234-2, 234-4 (designated by "Y−1" and "Y+1," respectively) can be refreshed (e.g., rewritten responsive to the hammering of row 234-3).

The refresh circuit 258 can include logic used to detect access (e.g., an activation) of a group of cells (e.g., a row) at a particular rate. For example, for a 32 nm process, if a row is accessed 550K times or more in a 64 ms refresh window, the row(s) physically adjacent to the accessed row can have a high probability of experiencing data corruption (e.g., a row hammer disturb). In response, the refresh circuit 258 can refresh a row (or rows) adjacent to the hammered row. Since the example above did not involve a remapped row of cells (e.g., since rows 234-1, 234-2, 234-3, 234-4, 234-5, . . . , 234-M are not remapped), the row hammer refresh results in refreshing of the adjacent rows (e.g., victim rows) in the main array 230 without refreshing of rows in the redundant array 232.

Figure 3:
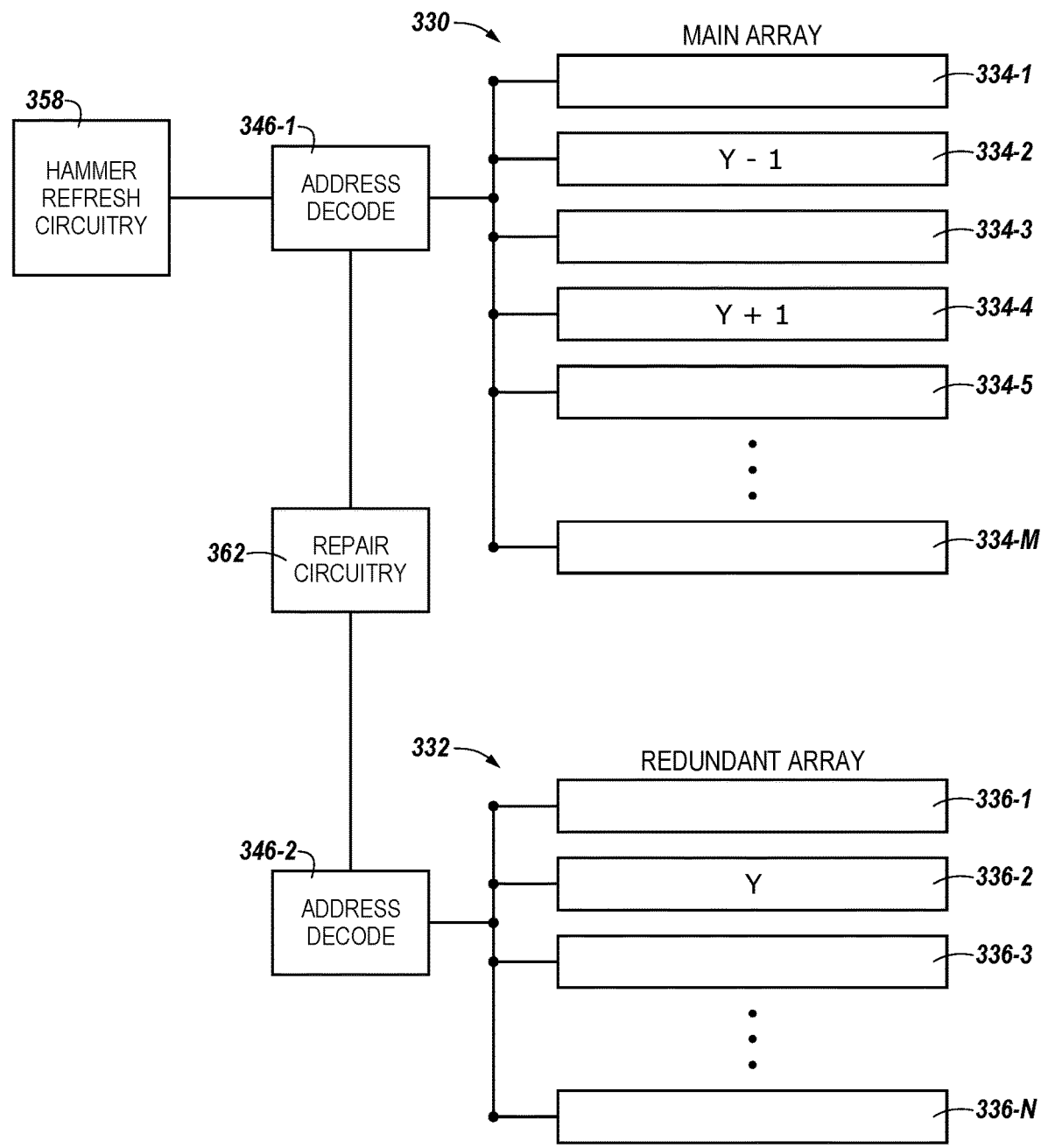
FIG. 3 is a schematic diagram illustrating a portion of a memory array in accordance with a number of embodiments of the present disclosure.

FIG. 3 is a schematic diagram illustrating a portion of a memory array in accordance with a number of embodiments of the present disclosure. The portion of the memory array illustrated in FIG. 3 can include a main portion 330 and a redundant portion 332 of a memory array. The main portion 330 can include a number of rows of cells 334-1, 334-2, 334-3, 334-4, 334-5, . . . , 334-M, where each row is coupled to an access line. For example, a first row 334-1 can be coupled to a first access line, a second row 334-2 can be coupled to a second access line, a third row 334-3 can be coupled to a third access line, a fourth row 334-4 can be coupled to a fourth access line, a fifth row 334-5 can be coupled to a fifth access line, . . . , and an Mth row 334-M can be coupled to an Mth access line. Designator "Y" is used to indicate a remapped row that has been remapped from row 334-3 to row 336-2. Designators "Y−1" and "Y+1" are used to indicate adjacent rows of a row (e.g., row 334-3) at a location prior to the remapping.

The main portion 330 can be coupled to an address decode 346-1, and the redundant portion 332 can be coupled to an address decode 346-2. The address decodes 346-1, 346-2 are coupled to a repair circuit 362. The repair circuit 362 can be used to repair a row of cells (e.g., row 334-3) by remapping the row 334-3 to a redundant row 336-2 (e.g., designated by "Y"). For example, a third row of cells 334-3 can be defective and, in response to the defect, be remapped. The repair circuit 362 can be controlled (e.g., by a controller) to determine whether to remap a defective row. For example, row 334-3 can be remapped to row 336-2 (e.g., designated by "Y").

Therefore, a request (e.g., by a controller such as controller 140 in FIG. 1) to access row 334-3 results in an access of redundant row 336-2. Therefore, in response to a rapid succession of attempts by the controller to access row 334-3, row 336-2 ("Y") will be accessed in rapid succession. The successive accesses associated with remapped row 334-3 can result in a determination that a row hammering event has occurred to row 334-3, which can result in hammer refresh circuitry 358 refreshing the rows (e.g., 334-2 and 334-4) in array 330 that are adjacent to row 334-3. However, due to the remapping of row 334-3 to row 336-2, the row actually experiencing the hammering event would be the redundant row 336-2, and the actual victim rows would be the adjacent redundant rows 336-1 and 336-3 (e.g., as opposed to rows 334-2 and 334-4). In order to ensure refreshing of the appropriate victim rows (e.g., 336-1 and 336-3 in this example), a lookup table could be consulted to determine to which redundant row 336 a particular row 334 has been remapped. However, maintaining a lookup table and/or consulting the lookup table each time a hammering event occurs can be costly (e.g., in terms of time, resources, die area, etc.).

In order to prevent an unnecessary refresh, and in order to refresh the correct rows (e.g., adjacent redundant row 336-1 and adjacent redundant row 336-3), a determination of whether there is a defect can be performed. For example, a determination of whether at least one of the rows 334-1 to 334-M of the main portion 330 includes a defect will be performed. In response to a determination that at least one of the rows 334-1 to 334-M includes a defect, a determination of where the group of cells with a defect was remapped is performed. In order to determine the remapped location, a mapping of an original location (e.g. row 334-3) to a remapped location (e.g., second redundant group of cells 366-2) is performed (e.g., by consulting an address table). This mapping can cost time and/or resources every time a row hammering event occurs.

Figure 4:
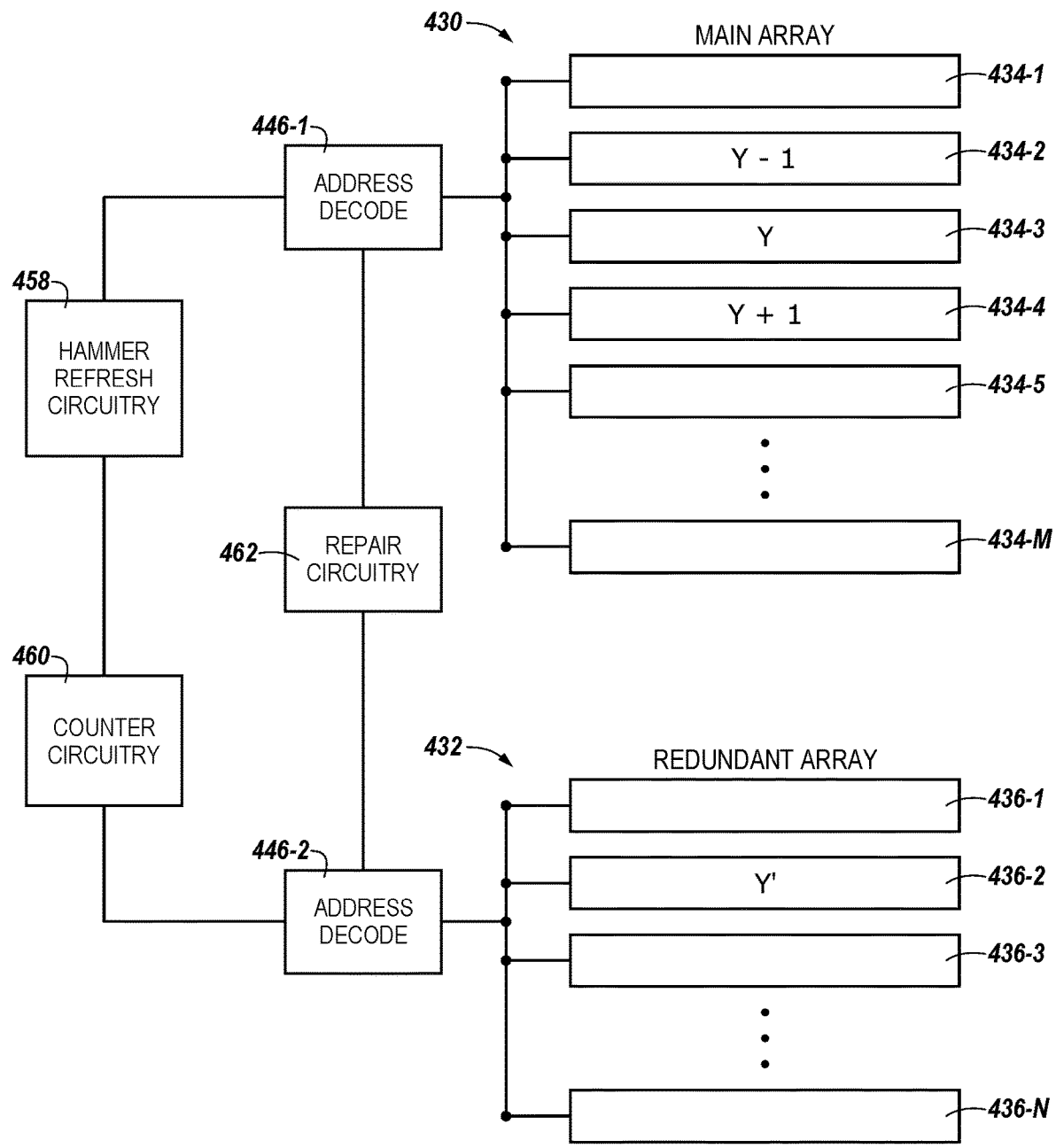
FIG. 4 is a schematic diagram illustrating a portion of a memory array in accordance with a number of embodiments of the present disclosure.

FIG. 4 is a schematic diagram illustrating a portion of a memory array in accordance with a number of embodiments of the present disclosure. The portion of the memory array illustrated in FIG. 4 can include a main portion 430 and a redundant portion 432. The main portion 430 can include a number of rows of cells 434-1, 434-2, 434-3, 434-4, 434-5, . . . , 434-M, where each row is coupled to an access line. A first row of cells 434-1 can be coupled to a first access line, a second row of cells 434-2 can be coupled to a second access line, a third row of cells 434-3 can be coupled to a third access line, a fourth row of cells 434-4 can be coupled to a fourth access line, a fifth row of cells 434-5 can be coupled to a fifth access line, . . . , and an Mth row of cells 434-M can be coupled to an Mth access line. Designator "Y" can indicate a row 434-3 that is not remapped. Designators "Y−1" and "Y+1" can indicate adjacent rows of row 434-3 (e.g., "Y"). A designator "Y'" can indicate a location that row 434-3 ("Y") is remapped to when row 434-3 ("Y") includes a defect.

The main portion 430 is coupled to an address decode 446-1, and the redundant portion 432 is coupled to an address decode 446-2. The address decodes 446-1, 446-2 are coupled to a repair circuit 462. The repair circuit 462 can be used to repair a row of cells (e.g., row 434-3) by remapping the physical address associated with row 434-3 to be associated with redundant row 436-2 (e.g., row "Y'"). For example, a physical address can be associated with the row 434-3, as illustrated, when the row 434-3 does not include a defect (e.g., a failure). The physical address can be remapped to redundant row 436-2 (e.g., "Y'") when row 434-3 (e.g., "Y") include a defect.

In response to the row 434-3 (e.g., "Y") being without defect, and a row hammering event occurring on the row 434-3 (e.g., "Y"), the refresh circuit 458 can perform a refresh (e.g., a row hammer refresh) on the row 434-2 (e.g., "Y−1") and on the row 434-4 (e.g., "Y+1"). This is because rows 434-2 and 434-4 (e.g., "Y−1" and "Y+1") are adjacent to row 434-3 (e.g., "Y"). In response to the row 434-3 including a defect (e.g., a failure) and a controller indicating to access (e.g., activate, select, etc.) the row 434-3 at a particular rate equal to a row hammer threshold rate, the refresh circuit 458 can perform a refresh on the redundant rows 466-1, 466-2, 466-3, . . . , 466-N. For example, attempts to access row 434-3 (e.g., "Y") in a rapid succession would indicate a row hammering event when row 434-3 is without defect. In response to row 434-3 being defective, the row 434-3 (e.g., "Y") can be remapped to row 436-2 (e.g., "Y'") and the refresh circuit 458 can cause a counter circuitry 460 to refresh the redundant rows 466-1 to 466-N. For example, the counter circuitry 460 can cycle through addresses associated with each of the rows 436-1, 436-2, 436-3, . . . , 436-N of the redundant portion 432 to refresh the redundant portion 432. In this way, accessing a mapping table that correlates a physical address originally associated with the main portion 430 to a physical address associated with the redundant portion 432 can be avoided as a determination of which adjacent redundant rows are experiencing hammer disturbs is not determined. Put another way, accessing the mapping table can be avoided by refreshing all redundant rows when attempting to access at least one defective and remapped row (e.g., such as defective row "Y") in the main portion at a particular rate. Attempting to access the at least one defective remapped row of the main portion 430 can result in a row of the redundant portion 432 (e.g., row 436-2 designated by "Y'") actually experiencing the row hammering event. For example, adjacent redundant rows 436-1 and 436-2 would experience row hammer disturbs when row 436-2 (e.g., "Y'") experiences the row hammering event.

A frequency of a refresh of the redundant portion can be based on a number of indications. For example, a redundant portion refresh can be based on at least one defective row in the main portion 430 attempting to be accessed at a particular rate (e.g., a number of times within a system refresh window) that equals a row hammering event. For example, a row hammering event can trigger a hammer refresh of the redundant portion 432. In some embodiments, the hammer refresh can be based on a predetermined amount of time within the refresh window in order to continually refresh the redundant portion 432 to avoid row hammer disturbs. The redundant portion refresh can be based on a time interval that is less than a system refresh of the main array 430. The refresh interval of the redundant portion 432 can be based on an adjustable frequency.

In this way, time and/or resources to determine whether to refresh can be preserved since the redundant portion 432 is a much smaller array than the main portion 430. For example, in some embodiments, a redundant portion can include eight (8) redundant rows compared to 512 main array rows per memory bank section. In addition, a higher refresh rate for the redundant row can minimize unnecessary refreshes of the main portion when the main portion includes at least one defective row. Further, row hammer metrics can be improved as incorrect refreshing of rows in the main portion (when the associated row hammered row was remapped to the redundant portion) is avoided.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array; and:
   circuitry coupled to the memory array to:
   refresh a first portion of the memory array at a system refresh rate;
   remap a first row of cells of the first portion to a second row of cells in a second portion of the memory array, the second portion comprising multiple rows of cells;
   responsive to a determination of a threshold access characteristic corresponding to the first row of cells in the first portion of the memory array, trigger a hammer refresh of all of the second portion of the memory array without determining addresses of rows of the second portion that are adjacent to the second row, wherein the hammer refresh is based on a time interval that is less than a time interval of the system refresh rate in order to continually refresh all of the second portion at a higher frequency than a frequency corresponding to the system refresh, and wherein the higher frequency is an adjustable frequency; and
   prevent refreshing, other than the system refresh, of the first portion of the memory array in response to the determination of the threshold access characteristic.

2. The apparatus of claim 1, wherein the determined threshold access characteristic occurs on a group of cells coupled to an access line of the second portion.

3. The apparatus of claim 1, comprising a controller configured to, responsive to an attempt to access the first row of memory cells in the first portion whose physical address has been mapped to the second row of cells in the second portion, access the second portion to which the physical address is mapped.

4. The apparatus of claim 3, wherein the threshold access characteristic comprises the controller accessing the second row of cells in the second portion greater than a threshold quantity of times within a particular amount of time.

5. The apparatus of claim 1, wherein the circuitry is configured to cause refreshing of all of the second portion without determining which rows of the second portion are adjacent to the second group.

6. A method, comprising:
   refreshing a first group of memory cells of a first portion of a memory array at a system refresh rate; and
   refreshing a second group of cells in a second portion of the memory array at a higher refresh rate than the system refresh rate to avoid row hammer disturbs within the second portion of the memory array, wherein the refresh of the second group is based on a time interval that is less than a time interval of the system refresh rate of the first group;
   wherein the second portion of the array comprises multiple groups of memory cells, wherein the second group of cells is adjacent to a third group of cells in the second portion of the memory array, and wherein the second group of cells in the second portion of the memory array is refreshed without determining an address of the second group of cells in the second portion of the memory array.

7. The method of claim 6, wherein the second group of memory cells comprises a redundant row of memory cells.

8. The method of claim 7, wherein the second portion of the memory array comprises multiple groups of memory cells comprising respective rows of memory cells, and wherein the method comprises continuously refreshing the second portion of the memory array at the higher rate responsive to the first group of cells of the first portion being accessed a threshold number of times within the refresh window corresponding to the system refresh rate.

* * * * *